(12) United States Patent
Houston

(10) Patent No.: US 8,380,478 B2
(45) Date of Patent: Feb. 19, 2013

(54) STATISTICAL EVALUATION OF CIRCUIT ROBUSTNESS SEPARATING LOCAL AND GLOBAL VARIATION

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1308 days.

(21) Appl. No.: 10/862,637

(22) Filed: Jun. 7, 2004

(65) Prior Publication Data

US 2005/0273308 A1    Dec. 8, 2005

(51) Int. Cl.
G06F 17/50    (2006.01)
(52) U.S. Cl. .............................. 703/14; 700/51
(58) Field of Classification Search ............... 703/2, 14, 703/13; 716/4–6, 1, 2, 17; 702/117; 257/E27.098, 257/E21.661; 324/537, 765, 769; 700/121, 700/51

See application file for complete search history.

(56) References Cited

U.S. PATENT DOCUMENTS

| 5,119,313 | A | | 6/1992 | Shaw et al. | |
| 5,301,118 | A | * | 4/1994 | Heck et al. | 700/109 |
| 5,325,054 | A | | 6/1994 | Houston | |
| 5,461,577 | A | | 10/1995 | Shaw et al. | |
| 5,521,524 | A | | 5/1996 | Houston | |
| 5,617,038 | A | | 4/1997 | Houston | |
| 6,108,181 | A | * | 8/2000 | Gerosa | 361/56 |
| 6,204,516 | B1 | * | 3/2001 | Shabde et al. | 257/48 |
| 6,298,470 | B1 | * | 10/2001 | Breiner et al. | 716/4 |
| 6,526,548 | B1 | * | 2/2003 | Voldman | 716/5 |
| 6,732,337 | B1 | * | 5/2004 | Neubert et al. | 716/4 |
| 6,859,031 | B2 | * | 2/2005 | Pakdaman et al. | 324/233 |

* cited by examiner

Primary Examiner — Mohammad Ali
(74) Attorney, Agent, or Firm — Rose Alyssa Keagy; Wade J. Brady, III; Frederick J. Telecky, Jr.

(57) ABSTRACT

Semiconductor fabrication using statistical analysis (400) to determine the robustness or reliability of a fabricated integrated circuit module given global and local variations of operating parameters of elements, such as transistors, of the module. Multiple sequences of statistical simulations (408, 414) are run to ascertain (416) the robustness of the module to local variations in an environment of global variations.

30 Claims, 3 Drawing Sheets

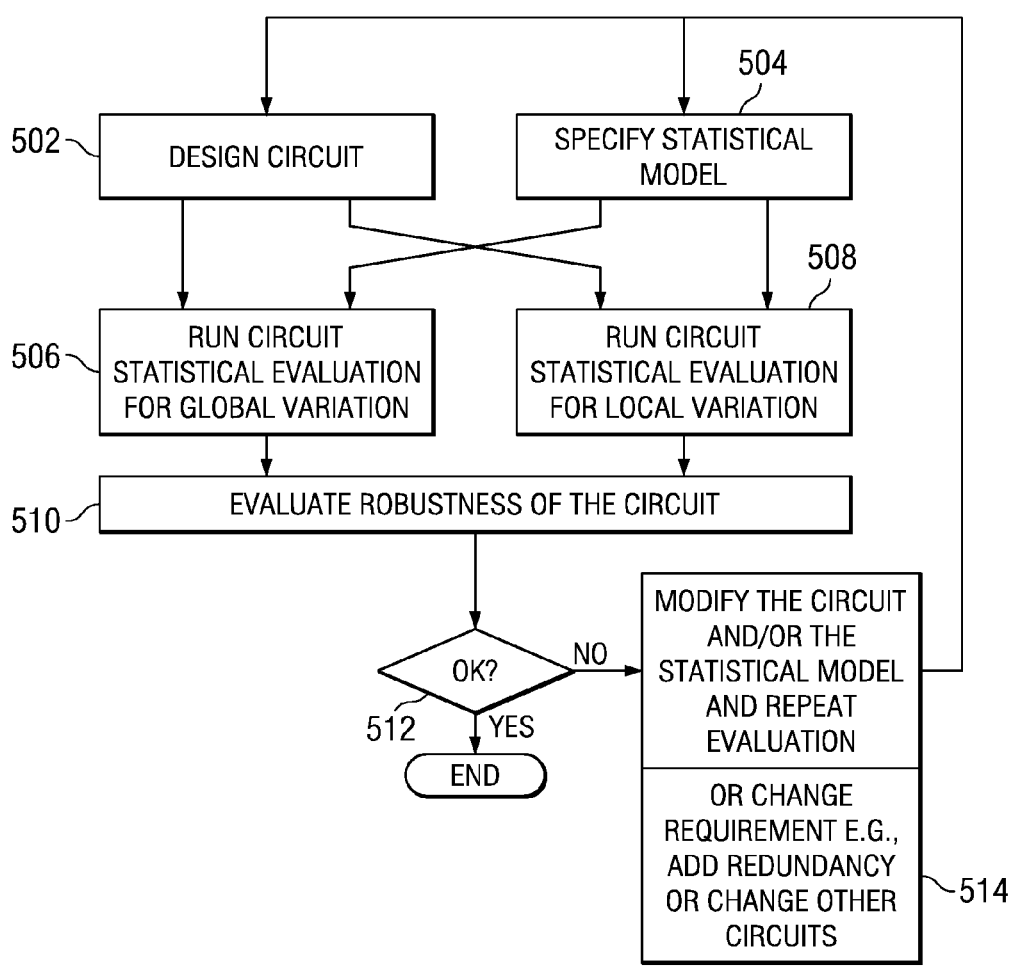

STATISTICAL EVALUATION OF CIRCUIT ROBUSTNESS SEPARATING LOCAL AND GLOBAL VARIATION

FIELD OF INVENTION

The present invention relates generally to semiconductor processing, and more particularly to monitoring the robustness or reliability of a circuit module in response to local variation over a range of global variation.

BACKGROUND OF THE INVENTION

In integrated circuit (IC) manufacturing, a wafer or otherwise generally round substrate passes through a number of different fabrication stages to form one or more integrated circuits thereon. The wafer is generally formed out of a semiconductor material, such as silicon, and may pass through the different stages one or more times to form multiple layers upon the wafer. Throughout the process, the wafer and layers are treated in various manners to establish one or more semiconductor modules upon the wafer. These modules can be considered the building blocks of the integrated circuits, and may also comprise other modules, sub-modules and/or elements, such as transistors, for example. A static random access memory (SRAM) cell is one type of semiconductor module, for example, that comprises a plurality of transistors as well as other types of integrated circuit elements. After the fabrication process is complete, one or more integrated circuits generally exist upon discrete sections of the wafer, known as die. The individual die can then be removed (e.g., cut) from the wafer and sold to consumers (e.g., as semiconductor "chips").

As noted, modules are made up of elements (e.g., transistors). It can be appreciated that variations within the fabrication process can affect element characteristics. Stated another way, variations of process conditions within the different fabrication stages can have an effect on the operating parameters and resulting performance of the elements. For example, varying (e.g., increasing) a process condition such as temperature, for example, at an annealing or heating stage of the fabrication process can, for example, facilitate a change in, among other things, a level of and/or rate of diffusion of a dopant substance in an element produced by the fabrication process (e.g., enhancing the level and/or rate of diffusion), whereby an operating parameter of the element, such as a switching speed of the element, for example, is resultantly altered (e.g., accelerated).

It can be appreciated that some variations within the fabrication process, or rather some variations of process conditions at the different stages of the fabrication process, can have a substantially uniform effect upon one or more elements fabricated thereby. For example, the operating parameter of threshold voltage (Vt) of a transistor type element is a function of multiple characteristics of the transistor, such as gate oxide thickness ($t_{ox}$) as well as level of channel doping, for example, where gate oxide thickness and channel doping are themselves a function of one or more process conditions at one or more fabrication stages.

Gate oxide thickness may, for example, be a function of a flow rate, temperature and/or viscosity, etc. of a substance applied to a wafer in establishing a layer of gate oxide material at a particular stage of the fabrication process, for example. A change in one or more of these process conditions will likely have the same effect on the thickness of the gate oxide layer across the entirety of the wafer or any resulting variations in the thickness of the gate oxide layer across the wafer will be gradual such that there will be substantially no resulting variation in thickness among elements that are in the same proximity. Accordingly, such variations in process conditions may be referred to as global variations since they have a substantially uniform effect upon the characteristic of gate oxide thickness ($t_{ox}$) and the operating parameter Vt across the wafer, or at least within a module. Similarly, uniform or gradual changes in characteristics, such as $t_{ox}$, for example, across a wafer can be referred to as global variations, and the effect of such global variations on similar elements with a module can be approximated to be the same. Also, element parameters, such as the aforementioned component of threshold voltage Vt, that vary as a result of other global variations can likewise be referred to as global variations. Generally speaking, global variations can be monitored and the process (conditions) controlled to keep such variations within a specified range.

By way of further example, changes in the process conditions of intensity of an energy source to which a resist layer is exposed and/or length of time that the resist layer is exposed to the energy source in one or more fabrication stages, may tend to have the same effect on dimensional characteristics of similar elements, where changes in dimensional characteristics may change electrical properties or operating parameters of the elements. Similarly, changes in the process conditions of amount of time that an etching process is allowed to continue, as well as chemical composition of an etching agent utilized in the etching process can have a global effect on one or more electrical characteristics of circuit elements. Again, such global variation can be monitored and the process (conditions) controlled to limit the range of such variation.

As applied to an SRAM cell, for example, a global variation in the electrical characteristics of the elements will cause a variation in the operating parameters of the SRAM cell, such as noise margin (SNM) and trip voltage (Vtrip). Exercising control over one or more process conditions to limit the global variation of the characteristics of the circuit elements (e.g., transistors) will in turn limit the range of operating parameters (e.g., SNM and/or Vtrip) of the SRAM cell incurred from the global variation of the circuit elements. If the global variation is essentially uniform across a die, then SRAM cells on a die will have the same operating parameters as influenced by the global characteristics of the elements. However, in addition to global variation there may also be local variation that may affect resulting devices, as discussed below.

It can be appreciated that changes in some process conditions can cause operating parameters and/or element characteristics to vary from element to element within a module. Some of such variations can occur over very short distances, for example, to produce a different effect on the individual elements. With regard to channel doping, for example, some dopants vary randomly at atomic distances (known as random doping fluctuation or RDF) such that different elements within the same module can have different doping characteristics and different resulting operating parameters. Such, variations that affect individual elements differently can be referred to as local variations. Accordingly, some portion of the operating parameter of threshold voltage Vt can vary from element to element (e.g., transistor to transistor) within the same module due to local variations of levels of channel doping, for example. Such variations in element parameters resulting from local variations can also be referred to as local variations. It can thus be appreciated that element characteristics and resulting operating parameters of the elements are affected by both global and local variations where the elements are uniformly affected by the global variations but are affected on a more individual basis by the local variations.

It will be further appreciated that both global and local variations will occur with some probability distribution. For example, Vt variation from RDF is generally Gaussian. However, while the global variation can usually be monitored and limited by process control to some bound (e.g., to +/−3 sigma), local variations (e.g., from RDF) generally can not be so limited, and thus are difficult to control. The choice of fabrication process(es) can affect the magnitude of the random variations, but they can not facilitate substantial control over random variation. That is, the sigma of the local variation may be reduced but the range of variation in terms of number of sigma is still not controlled. For example, the probability for local variation may be that approximately one out of 3 million elements will be at the 5 sigma range. For an SRAM module, for example, if the failure point of a cell is at 5 sigma of a local variation, then it can be expected that approximately one out of 3 million elements (e.g., memory cells) within the module will fail from that local variation. Some modules, such as inverter chains, are not sensitive to the variation of single elements since the effect is averaged out. However, other modules, such as SRAM cells are sensitive to the variations of single elements. Thus, it would be desirable to be able to predict the impact of the (substantially uncontrollable) local variations within the environment of the (somewhat controllable) global variations to determine the robustness or reliability of an integrated circuit module, where the robustness of the module may be described in terms of a distribution of an operating parameter of the fabricated module, such as noise margin (SNM) or trip voltage (Vtrip) for an SRAM cell, for example.

In the past, parametric models for transistors have been used in circuit simulators such as SPICE. These include statistical parametric models in which the probability distribution of the parameters can be specified. The distribution for global variation and local variation can be specified separately, where the parameter value used in a circuit simulation combines a global and a local value. The local value distribution can be centered at zero so that the local distribution represents a variation around the global value. The statistical parametric models are specified to represent the measured or expected variations of the transistor characteristics that result from variations in the fabrication of the transistors. There are also routines to use circuit simulators and the statistical parametric models to predict a range of circuit performance. What is needed is an efficient way to use these tools to judge the robustness of a circuit to local random variation in the environment of the controlled global variation.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to determining circuit module robustness or reliability as relates to local and global variations, and in view of the number of modules and yield desired as facilitated by implementing statistical analyses. Robustness to local variation is considered at worst case global conditions, where worst case global takes into account control of the global parameters. Global and local variations are treated differently in statistical analysis of modules since the range of global variation can generally be controlled while the range of local variation can not.

According to one or more aspects of the present invention a system operative to test the robustness of a circuit module is disclosed. The system includes a component operative to convey global variation data associated with the module as well as a component operative to convey local variation data associated with the module. The system further includes a modeling component operative to model behavior of the module in response to the global variation data and the local variation data and to generate an output indicative of the robustness of the circuit module to local variation over a range of global variation.

In accordance with one or more other aspects of the present invention, a method of determining the robustness of a circuit module is disclosed. The method includes performing a sequence of global statistical evaluations of the circuit module based upon global variation data, and determining a global vector about which to run a local statistical evaluation based upon the sequence of global statistical evaluations. The method thus further includes performing a sequence of local statistical evaluations about the determined global vector. The method then includes evaluating the robustness of the circuit based upon the global and local statistical evaluations.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 5 is a flow diagram illustrating another exemplary methodology that is operative to determine the robustness of a circuit module according to one or more aspects of the present invention.

DETAILED DESCRIPTION OF THE INVENTION

Figure 1:
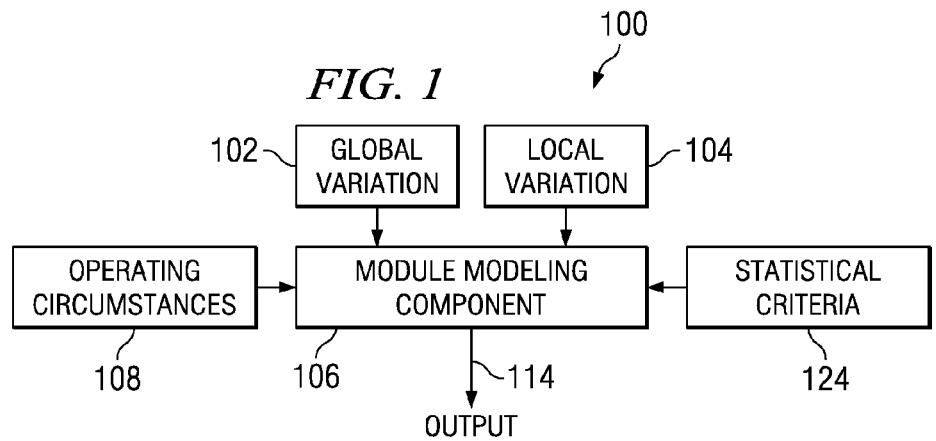
FIG. 1 is a functional block diagram of a system operative to test the robustness of a circuit module in accordance with one or more aspects of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, that one or more aspects of the present invention may be practiced with a lesser degree of these specific details. In other instances, well-known structures and devices are shown in block diagram form in order to facilitate describing one or more aspects of the present invention.

Integrated circuit module performance in view of local and global variations and desired device performance and yield is evaluated utilizing statistical analysis, among other things. A distribution of module operating parameters (e.g., SNM or Vtrip for an SRAM cell) in response to global variations is simulated, and a worst case response is determined based upon global variation (e.g., the 3 sigma worst case response). A distribution in response to local variations for the set/vector of worst case global parameters is then separately simulated, where worst case global takes into account the control of the global parameters (e.g., to 3 sigma). From these, a robustness of the module to local variation of element parameters at the worst case global response is determined. For example, for a memory array with 4 million SRAM cells/modules, it may be desirable to have respective cells robust to 5 sigma or more of local variations even though global variations may be controlled to 3 sigma.

Global and local variations are treated differently in the statistical analysis since the range global variation can be somewhat controlled while the range of local variation generally can not. One or more aspects of the present invention thus facilitate efficiently predicting the impact of local variation on yield in view of global variation. Inadequacies associated with conventional techniques of simulating combined global and local variations where merely the global range is restricted are thereby addressed. Such a combined analysis could, for example, predict the fraction of failing modules averaged over an entire wafer, but would not predict the number failing within particular die, where the number failing within die is needed to determine redundancy requirements and/or whether a desired yield has been satisfied.

As mentioned above, in integrated circuit (IC) manufacturing, a wafer is passed through a number of different fabrication stages in forming one or more integrated circuits on the wafer. Throughout the fabrication process the wafer and layers formed thereon are treated in various manners to establish one or more semiconductor modules upon the wafer. These modules can be considered the building blocks of the integrated circuits, and may also comprise other modules, submodules and/or elements, such as transistors, for example. A static random access memory (SRAM) cell is one type of semiconductor module, having a plurality of transistor type elements, for example. After the fabrication process is complete, one or more integrated circuits generally exist upon discrete sections of the wafer, known as die. The individual die can then be removed (e.g., cut) from the wafer and sold to consumers (e.g., as semiconductor or processing "chips").

Turning to FIG. 1, a system 100 is illustrated that is operative to facilitate a determination of the performance parameter of robustness or reliability of a circuit module, such as a static random access memory (SRAM) cell, for example, in accordance with one or more aspects of the present invention. The system 100 is depicted schematically in functional block diagram form and includes a component operative to convey global variation data or an expected distribution of global values 102. This data 102 corresponds to a set of randomly chosen element parameters that vary uniformly across like elements within the module of interest. Such parameters may include, for example, a global aspect of a threshold voltage Vt, flatband voltage and/or carrier mobility. The parameters are chosen randomly according to a probability distribution for the respective parameters. By way of example, the global variation data 102 may also correspond to respective ranges that process conditions such as flow rates, temperatures, exposure times, etch times, etc. may drift within during the fabrication process. Global variation data may further include variations in element characteristics such as gate oxide layer thickness, for example.

The system 100 also includes a component operative to convey local variation data or an expected distribution of local values 104. This data 104 similarly corresponds to a set of randomly chosen element parameters. These parameters, however, vary independently across like elements within the module of interest. Such parameters may include, for example, a local aspect of a threshold voltage Vt, flatband voltage and/or gate length. The local parameters are similarly chosen randomly according to a modeled probability distribution for the respective parameters. By way of example, the local variation data 102 may also correspond to respective ranges that process conditions such as channel doping, etc. may drift within during the fabrication process. Local variation data may further include local variations in element characteristics. It will be appreciated that components 102, 104 may be any type of suitable peripherals, such as computer systems or the like that may be user operated and/or programmed to operate somewhat automatically to convey the global and local data.

Both the global 102 and local 104 variation data feed into a module modeling component 106. The modeling component 106 is operative to simulate or "test" the behavior of the circuit module given the global 102 and local 104 variations. For example, the modeling component 106 may calculate or predict the reaction of the circuit module to certain operating circumstances 108 in view of the global and local variations that the module may have experienced during fabrication. The operating circumstances 108 may, for example, include respective values of applied voltages, temperature, AC frequencies, load sizes, etc. that the circuit module is expected to face during normal usage.

It will be appreciated that, according to one or more aspects of the present invention, the modeling component generally does not act upon global 102 and local 104 variation data simultaneously, but instead utilizes one or the other in separate runs. Further, it will be appreciated that the modeling component 106 may, for example, be implemented with simulation program (e.g., SPICE an industry standard circuit simulation program) technology, among other things. It will also be appreciated that the modeling component 106 may implement Monte Carlo type routines, for example, to randomly generate values of the (local or global) element parameters in calculating the response of the circuit module.

Repeated circuit module simulations with randomly selected element parameters gives a distribution of the module operating parameters (such as SNM or Vtrip for an SRAM cell) reflecting the given distribution of element parameters. Statistical criteria 124 may also be fed into component 106 indicative of global tolerances. For example, global variation may have to be controlled to within three sigma. Alternatively, the selection of element parameters under global variation may be unrestricted, and the impact of the control of the global parameters is taken into account in the interpretation of the distribution of the circuit module operating characteristic. For example, if the global parameters are controlled to 3 sigma in manufacture, if can be approximated that the range of the module operating parameter will be within 3 sigma.

In another example, the global variation of element parameters may be restricted to a range that may occur within a die or within an array of memory cells. In this case, the global parameters may be centered at some set of values other than nominal, such as at a statistically worst case value, with the restricted global variation about the selected center global vector (set of global parameter values) concurrently with local variation. For each simulation, all like elements in a module are given a common global parameter vector while each element may have randomly different local parameter vectors. Since local variation is not controlled, however, similar limitation of local variation data is not included as the expected spread of the local parameters, e.g. one sigma or 6 sigma, depends upon the number of instances.

In determining module robustness, the modeling component 106 may, for example, generate histograms for the parameter of interest given the statistical criteria 124, operating circumstances 108 and the local 104 and global 102 variations. According to one or more aspects of the present invention, data 114 is output from the component 106 indicative of the robustness of the circuit module to the local variation over a range of global variation. From this it can be determined whether the circuit or some processing conditions should be redesigned, whether the statistical model should be adjusted or how much redundancy may be needed to achieve a desired yield.

By way of example, in accordance with one or more aspects of the present invention, the modeling component 106 may initially perform a sequence of simulations over respective sets of randomly chosen element parameters to ascertain respective values of the operating parameter of interest (e.g., Vtrip). For example, if the global variation data pertains to two element parameters, such as flatband voltage and mobility, and these parameters can respectively vary between exemplary values of 1-3 and A-C, component 106 may model the behavior of the module by randomly picking a number of samples from the nine possible combinations of input values (e.g., 1,A; 1,B; 1,C; 2,A; 2,B; 2,C; 3,A; 3,B; 3,C). The samples would be chosen according to the probability distribution for the respective parameters. For example, if the value of 2 for the first parameter and the value of B for the second parameter are twice as likely to occur, then the set of 2,B may likely be chosen two times as often as any other possible combination. It will be appreciated that such global simulations are done with zero local variations. In this manner, this first sequence of simulations determines the global variation of the operating parameter of interest (e.g., Vtrip for an SRAM cell).

The modeling component 106 may similarly perform a sequence of simulations over respective sets of randomly chosen local element parameters to ascertain the local distribution of the module parameter. For example, if the local variation data corresponds to two element parameters, such as flatband voltage and gate length, and these parameters can respectively vary between exemplary values of 4-6 and D-F, component 106 may model the behavior of the module by randomly choosing a number of samples from the nine possible combinations of input values (e.g., 4,D; 4,E; 4,F; 5,D; 5,E; 5,F; 6,D; 6,E; 6,F), again chosen in accordance with their probability distribution. The local element parameters generally range from negative to positive, generally centered about zero, as these parameters represent variation about the global value.

These local simulations are performed about a single set or vector of global values (e.g., 2,B). For example, this second sequence of simulations may be performed with the local variation of element parameters about the mean global values. Such a choice of global values would be relatively easy to implement and generally valid, particularly where the local distribution of the module parameter is not a strong function of the global parameters. In another example, the second sequence of simulations may be done with the local variation of element parameters about a set of global parameters chosen based upon the global distribution of the module operating parameter of interest. For example, the global vector chosen for the second sequence may be a set that gives approximately the 3 sigma worst case response of the module operating parameter in the module operating parameter global distribution.

It will be appreciated that the number of local sigma margin at the statistically worst case global vector required for adequate yield depends on several factors including, among other things, the required yield, the number of instances of the module on a chip, and whether or not redundancy can be used to replace failing modules. If, for example, there is only one module on a chip and failure of one out of about 1000 is acceptable yield, then a margin of about 3 sigma may be acceptable. If instead, there are roughly 8 million modules on a chip and redundancy can repair approximately 3 failing bits out of 1 million, (where other redundancy is reserved for repair of defects) then a margin of greater than about 4.5 sigma may be required. If there is no redundancy, or redundancy is to be reserved for defects, then a margin of greater than about 6 sigma may be required. Alternatively, for some module operating parameters, the margin in terms of local sigma may be set and the minimum acceptable operating parameter determined. For example, the distribution of Vtrip in response to global variation and in response to local variation can be used to determine how low a bit-line must be pulled by WRITE circuitry in order to have a desired robustness to local variation at a worst case global setting.

Figure 2:
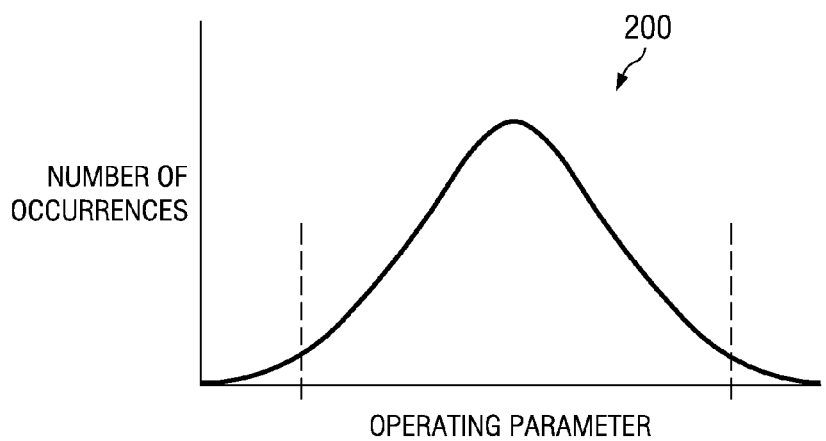
FIG. 2 is an exemplary histogram of the robustness of a circuit module to global variation.
Figure 3:
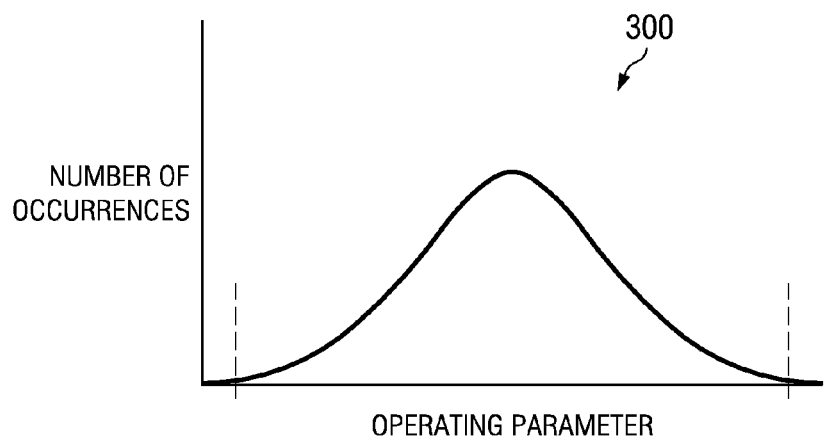
FIG. 3 is an exemplary histogram of the robustness of a circuit module to local variation over a range of global variation.

Turning to FIGS. 2 and 3, as mentioned above the modeling component 106 may, for example, be adapted to generate histograms when processing the global and local variation data, where the histograms are merely graphical representations of distributions of an operating parameter of interest. FIG. 2 thus illustrates an exemplary histogram 200 of the operating parameter of interest for the global variation with no local variation, while FIG. 3 illustrates an exemplary histogram 300 of the operating parameter for the local variation at some global vector or set of element parameter values. The operating parameter of interest is plotted on the x-axis, while the number of occurrences of particular values of the parameter of interest generated by the modeling component 106 are plotted on the y-axis. For an SRAM device, for example, the exemplary plots may be for the operating parameter of Vtrip, in which case the values plotted along the x-axis would be measured in units of volts or milli-volts. It will be appreciated that a Gaussian distribution of module operating parameters generally results from a Gaussian distribution of element parameters. Distributions resulting from other types of element parameter distributions can also be evaluated, however.

According to one or more aspects of the present invention, the local variation is determined around global values so that the robustness of the circuit module to local variation over a specified range of global variation can be evaluated. Thus, the values of element parameters that generate values of the module operating parameter of interest (e.g., Vtrip) corresponding to those at some particular demarcation in FIG. 2 are utilized in generating values of Vtrip for the local variation simulations. Such global element parameter values may correspond to a vector that corresponds to a 3 sigma worst case operating parameter as determined from the histogram of FIG. 2, for example.

By way of example, if a 3 sigma worst case Vtrip value is produced when parameter values of 2,C are used for flatband voltage and mobility, respectively, then the modeling component 106 would apply a plurality of samplings from the local variation parameter values 4,D; 4,E; 4,F; 5,D; 5,E; 5,F; 6,D; 6,E; 6,F about the global process condition values of 2,C when modeling the behavior of the module for the local variation runs. The robustness of the module can then be expressed as the number of local sigma margin there is between the minimum acceptable value for the operating parameter and the mean operating parameter value under local variation about the chosen global vector, such as the global vector corresponding to the 3 sigma worst case operating parameter under global variation. If the resulting number of local sigma is greater than required for adequate yield, then the module can be said to be sufficiently robust to local variation over the range of global variation. If the margin in terms of local sigma is inadequate, the module may have to be redesigned and/or process conditions may have to be altered. Alternatively, the specification for the module may be changed and/or the surrounding circuitry may be changed. The circuit module can then be re-tested within the system 100 to see if it is then adequately robust to local variation over the range of global variation.

It will be appreciated that the statistical worst case of the operating parameter in response to global variation without local variation can be determined according to the planned process control for global variation. For example, the statistical worst case may be taken to be the mean minus three standard deviations. From a log of the simulations run to generate this histogram of FIG. 2, it is possible to select a global vector that produced the statistical worst case operating parameter. Note that the statistical worst case (such as at the −3 sigma point) is greater (better) than the absolute worst case because of the low probability of all the global parameters being at worst case at the same time. Also, there may be a variety of global vectors that will produce an operating parameter value about equal to the statistical worst case. The standard deviation of the operating parameters in response to local variation can be obtained from the histogram in FIG. 3. Also, the mean of the operating parameter obtained from the histogram of FIG. 3 may be lower than the value of the operating parameter evaluated without local variation. This lowering of the mean under local variation is a result of the possible asymmetry caused by the local variation. For example, asymmetry in an SRAM cell may make the cell more stable for storing a '1' and less stable for storing a '0'. Since the cell must be operative to store either a '1' or a '0', it is the lower of the two stabilities that is a measure of the stability of the cell. For each evaluation of the noise margin of the cell (where noise margin is a measure of the stability of the cell), the noise margin is evaluated for both storing a '1' and storing a '0' and the lower result of the two evaluations is taken as the noise margin of the cell at the condition being evaluated. Thus the asymmetry caused by local variation reduces the robustness of the cell. This effect can be implicitly taken into account by using the mean under local variation rather than the mean under global variation in evaluating the robustness of the cell. If the mean under global variation is used in the evaluation of the robustness of a circuit module, then any degradation of the operating parameter caused by the possible asymmetry of local variation must be explicitly taken into account in the evaluation of robustness of the module under local variation.

Figure 4:
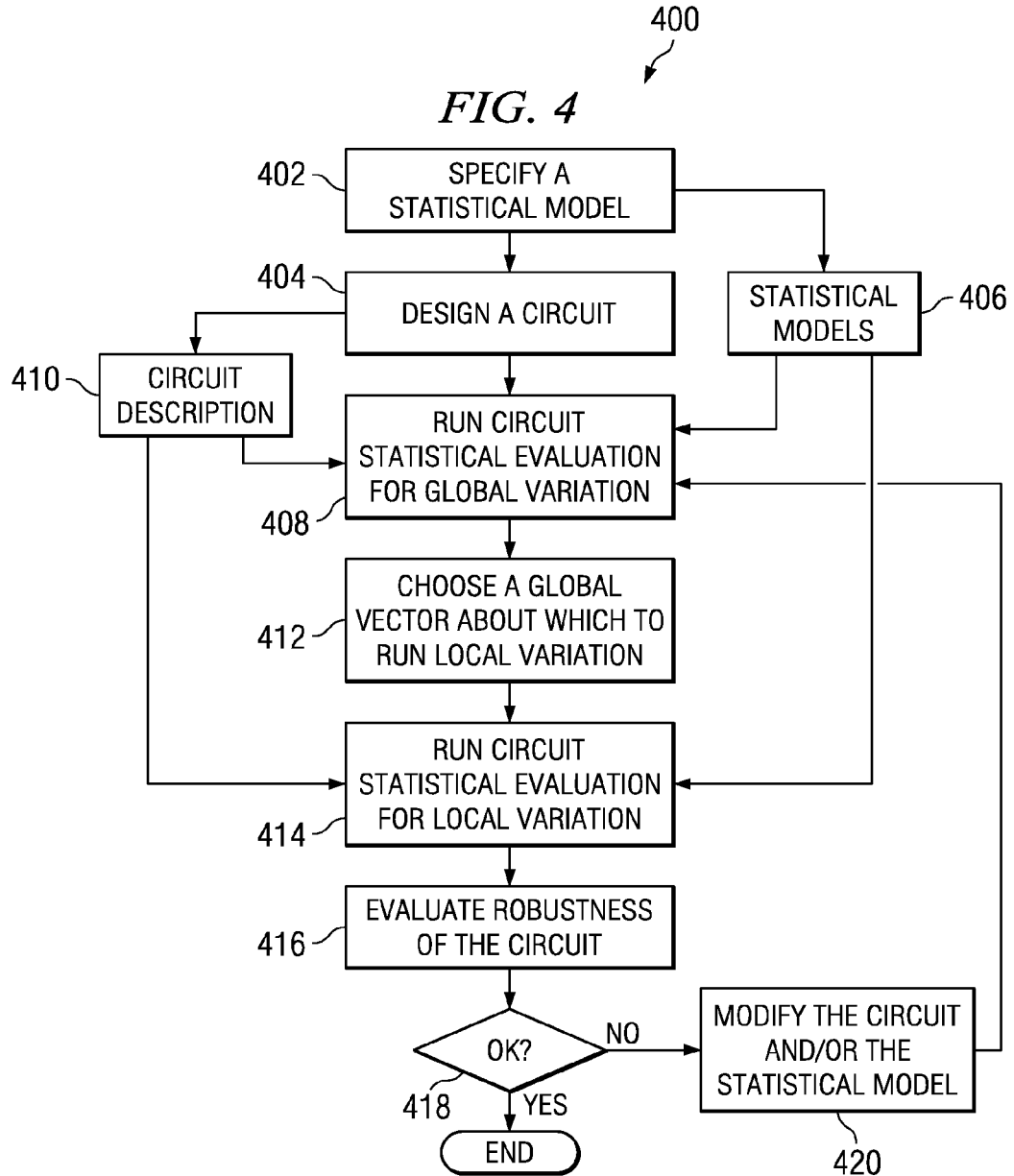
FIG. 4 is a flow diagram illustrating an exemplary methodology operative to determine the robustness of a circuit module in accordance with one or more aspects of the present invention.

Turning to FIGS. 4 and 5, exemplary methodologies 400, 500 are illustrated that facilitate a determination of the robustness of a circuit module according to one or more aspects of the present invention. It will be appreciated that although the methodologies 400, 500 are illustrated and described hereinafter as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

With reference to FIG. 4, the method 400 begins at 402 where one or more statistical models are specified. After the model is specified, the method advances to 404 where a circuit module is designed, and also to 406 where the statistical model is forwarded to 408 for a statistical evaluation for global variation. The designed circuit module from 404 is also forwarded to the statistical evaluation at 408. The circuit module from 404 is similarly forwarded to a circuit description at 410. The description at 410 is likewise advanced to the global evaluation at 408. Once the global evaluation is performed, the method advances to 412 where a global vector about which a local variation may be run is chosen. In one example, a global vector is chosen corresponding to a value of the operating parameter based on the process control. For example, a global vector may be chosen that corresponds to the 3 sigma worst case value of the operating parameter. In another embodiment, the range of global parameters in the statistical evaluation at 408 is restricted to reflect the process control, and the global vector chosen corresponds to the worst case operating parameter resulting from the statistical evaluation at 408. Subsequently, the method advances to 414 where a statistical evaluation for local variation is run in view of the chosen global vector from 412 as well as statistical models from 406 and circuit description from 410. In another example, a limited variation of the global parameters is convolved with the local variation, where the limited range of global variation represents the variation of global parameters that may occur within a die or within a memory array. Thereafter, the method advances to 416 where the robustness of the circuit, as measured in terms of a distribution of an operating parameter of the circuit module, is determined according to:

$$\text{robustness} = \frac{\mu_L - \text{minimum acceptable value of the operating parameter}}{\sigma_L}$$

where
  $\mu_L$ is the mean value of the operating parameter from the local evaluation,
  $\sigma_L$ is the standard deviation of the operating parameter from the local evaluation, and
  robustness is the margin above the minimum acceptable value of the operating parameter at the chosen global vector expressed in number of local sigma.

Then, at 418 a determination is made regarding whether the determined robustness is satisfactory. If so, the methodology ends. Otherwise, the method proceeds to 420 where the circuit and/or statistical model are modified. The method then returns to 408 where another statistical evaluation for global variation is performed. The method subsequently proceeds as before, and continues to do so, until a sufficiently robust circuit design is ascertained.

In another example the desired value of robustness is set and the equation is solved to find the minimum operating parameter to give that level of robustness. For example, in writing to an SRAM cell, the bit line must be pulled down to a voltage below the trip voltage of the cell. Thus the minimum acceptable trip voltage is the voltage down to which the WRITE circuitry pulls the bit line during WRITE. The equation then can be solved to determine how low the WRITE circuitry must pull the bit line during WRITE to have the desired robustness for the given SRAM cell.

Turning to FIG. 5 a flow diagram illustrates an alternative exemplary method 500 for determining circuit robustness according to one or more aspects of the present invention. Beginning at 502 a circuit is designed, and at 504 a statistical model is specified. From the circuit design at 502, the method advances to 506 where a statistical evaluation is run for global variation, and also to 508 where a statistical evaluation is run for local variation with the nominal global vector. In an alternative embodiment, a limited variation of the global parameters is convolved with the local variation in 508, where the limited range of global variation represents the variation of global parameters that may occur within a die or within a memory array. Similarly, after the statistical model is specified at 504 the method also advances to 506 and 508 for respective global and local statistical evaluations. After the global and local statistical evaluations are performed at 506 and 508, respectively, the method advances to 510 where circuit robustness is determined according to:

$$\text{robustness} = \frac{\mu_L - nX\sigma_G - \text{minimum acceptable value of the operating parameter}}{\sigma_L}$$

where
  $\mu_L$ is the mean value from the local evaluation,
  $\sigma_L$ is the standard deviation from the local evaluation,
  $\sigma_G$ is the standard deviation from the global evaluation, and
  n is the number of $\sigma_G$ that the process will be controlled to.

Then, at 512 a determination is made regarding whether the determined robustness is satisfactory. If so, the methodology ends. Otherwise, the method proceeds to 514 where the circuit, statistical model and/or other requirements are changed, such as by adding redundancy or changing other circuitry. The method then returns to 502 and 504 and a subsequent iteration is run. This is repeated until a sufficiently robust circuit design is ascertained and/or until a minimum operating parameter is determined that gives a desired robustness. If the circuit module robustness is greater than necessary, there may be some redesign to optimize some other aspect with some reduction of the robustness of the operating parameter that had greater than necessary robustness. For circuit modules with multiple critical operating parameters, the design may be iterated to achieve a balance of robustness for the multiple critical operating parameters. For example, the design of an SRAM cell may be iterated to achieve a balance of robustness for noise margin and trip voltage over the voltage and temperature ranges of operation.

One or more aspects of the present invention thus provide a concise and consistent evaluation of the robustness of a circuit with clear identification of the global and local effects. This can aid in circuit design and can be a guide to process control. It provides a way to design a circuit in view of a range of global variations that may be controlled and range of local variations that can not be controlled, but can be expected.

It s to be appreciated the term component can refer to a computer-related entity (e.g., hardware, a combination of hardware and software, software, software in execution, a process running on a processor, a processor, an object, an executable, a thread of execution, a program, a computer, an application running on a server, a server). Data may likewise refer to information that is in a useable format and/or that can be manipulated in a desired manner (e.g., by a computer). It is also to be appreciated that various aspects of the present invention may employ technologies associated with facilitating unconstrained optimization (e.g. back-propagation, Bayesian, Fuzzy Set, Non Linear regression, or other neural network paradigms including mixture of experts, cerebellar model arithmetic computer (CMACS), Radial Basis Functions, directed search networks, and functional link nets).

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. For example, the embodiments have been described for operating parameters with minimum acceptable values. Application can also be made for operating parameters with maximum acceptable values. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein simply means an example, rather than the best.

What is claimed is:

1. A system operative to simulate robustness of a circuit module containing elements, a processor:
  a component, running on the processor, that conveys an expected distribution of global values associated the with elements of the module;
  a component that conveys an expected distribution of local values associated with elements of the module; and
  a modeling component that models behavior of the module and generates an output indicative of the robustness of the circuit module to random local variations of the elements for a chosen range of substantially uniform global variations of the elements, in response to the global values and the local values;
  wherein the random local variations affect each of the elements differently throughout the module, while the substantially uniform global variations affect the each of the elements substantially uniformly throughout the module.

2. The system of claim 1, wherein the modeling component determines a distribution of values of an operating parameter of the circuit module in response to the local and global values.

3. The system of claim 2, wherein the modeling component utilizes a chosen vector of global values when determining the distribution of values of the operating parameter in response to the local values.

4. The system of claim 3, wherein the modeling component generates an indication of the robustness of the circuit module according to this formula:

$$\text{robustness} = \frac{\mu_L - \text{minimum acceptable value of the operating parameter}}{\sigma_L}$$

where $\mu_L$ of the formula is a mean value of the operating parameter from a local evaluation,
$\sigma_L$ of the formula is a standard deviation of the operating parameter from the local evaluation, and
robustness of the formula is a margin above a minimum acceptable value of the operating parameter at the chosen global vector expressed in number of local sigma.

5. The system of claim 4, wherein the minimum acceptable value of the operating parameter corresponds to a voltage that a bit line must be pulled down to during a WRITE operation to get a targeted robustness for the circuit module known as trip voltage.

6. The system of claim 4, wherein the chosen global vector is a worst case vector.

7. The system of claim 3, wherein the modeling component generates an output indicative of the robustness of the circuit module according to this formula:

$$\text{robustness} = \frac{\mu_L - nX\sigma_G - \text{minimum acceptable value of the operating parameter}}{\sigma_L}$$

where
$\mu_L$ of the formula is a mean value from a local evaluation,
$\sigma_L$ of the formula is a standard deviation from the local evaluation,
$\sigma_G$ of the formula is a standard deviation from a global evaluation, and
n of the formula is a targeted number of the standard deviations from a global evaluation ($\sigma_G$).

8. The system of claim 3, wherein the modeling component produces a distribution of the operating parameter for the global values and the local values.

9. The system of claim 3, wherein the modeling component utilizes operating circumstances in determining the distribution of values of the operating parameter.

10. The system of claim 3, wherein the modeling component utilizes statistical criteria in generating the output indicative of the robustness of the circuit module.

11. The system of claim 1, wherein the modeling component is implemented with a circuit simulation program.

12. The system of claim 1, wherein the modeling component implements circuit simulations with randomly selected element parameter values.

13. A method of using a computer system having components for determining robustness of a circuit module containing elements, comprising:
performing a sequence of global statistical evaluations of the circuit module based upon an expected distribution of global values;
determining a global vector about which to run a local statistical evaluation based upon the sequence of global statistical evaluations;
performing a sequence of local statistical evaluations about the determined global vector and based upon an expected distribution of local values; and
evaluating the robustness of the circuit based upon the global and local statistical evaluations;
wherein the local values affect each of the elements differently throughout the circuit module, while the global values affect the each of the elements substantially uniformly throughout the circuit module.

14. The method of claim 13, wherein a distribution of values of an operating parameter of the circuit module are determined based upon the global and local evaluations, and wherein the robustness of the circuit module is evaluated according to this formula:

$$\text{robustness} = \frac{\mu_L - \text{minimum acceptable value of the operating parameter}}{\sigma_L}$$

where
$\mu_L$ of the formula is a mean value of the operating parameter from the local evaluations,
$\sigma_L$ of the formula is a standard deviation of the operating parameter from the local evaluations, and
robustness of the formula is a margin above a minimum acceptable value of the operating parameter at the determined global vector expressed in number of local sigma.

15. The method of claim 14, wherein the minimum acceptable value of the operating parameter corresponds to a voltage that a bit line must be pulled down to during a WRITE operation to get a targeted robustness for the circuit module known as trip voltage.

16. The method of claim 13, wherein a distribution of values of an operating parameter of the circuit module are determined based upon the global and local evaluations, and wherein the robustness of the circuit module is evaluated according to this formula:

$$\text{robustness} = \frac{\mu_L - nX\sigma_G - \text{minimum acceptable value of the operating parameter}}{\sigma_L}$$

where
$\mu_L$ of the formula is a mean value from the local evaluations,
$\sigma_L$ of the formula is a standard deviation from the local evaluations,
$\sigma_G$ of the formula is a standard deviation from the global evaluations, and
n of the formula is a targeted number of the standard deviations from a global evaluation ($\sigma_G$).

17. The method of claim 13, further comprising:
specifying a statistical model for use in the global and local statistical evaluations.

18. The method of claim 17, further comprising:
designing a circuit for use in the global and local statistical evaluations.

19. The method of claim 18, further comprising:
modifying at least one of the statistical model and the circuit design if the module is not sufficiently robust.

20. A method of using a computer system having components for determining robustness of a circuit module containing elements, comprising:
determining an expected global distribution and an expected local distribution of parameters for the elements of the circuit module;

performing global evaluations by determining a distribution of an operating parameter of the circuit module in response to the global distribution of element parameters in the absence of the local distribution;

performing local evaluations by determining a distribution of the operating parameter of the circuit module in response to the local distribution of the element parameters for a selected set of global element parameters, the performing local evaluations being separate from the performing global evaluations; and determining a margin for random local variations of the local distribution of the element parameters for a chosen range of substantially uniform global variations of the global distribution of the element parameters, the margin being the robustness of the circuit module;

wherein the random local variations affect each of the elements differently throughout the circuit module, while the substantially uniform global variations affect the each of the elements substantially uniformly throughout the circuit module.

21. The method of claim 20, wherein the selected set of global element parameters corresponds to a nominal set of global element parameters.

22. The method of claim 21, wherein the robustness is evaluated according to this formula:

$$\text{robustness} = \frac{\mu_L - nX\sigma_G - \text{minimum acceptable value of the operating parameter}}{\sigma_L}$$

where
- $\mu_L$ of the formula is a mean value from the local evaluations,
- $\sigma_L$ of the formula is a standard deviation from the local evaluations,
- $\sigma_G$ of the formula is a standard deviation from the global evaluations, and
- n of the formula is a targeted number of the standard deviations from a global evaluation ($\sigma_G$).

23. The method of claim 20, wherein the selected set of global element parameters corresponds to a worst case global operating parameter.

24. The method of claim 23, wherein the robustness is evaluated according to this formula:

$$\text{robustness} = \frac{\mu_L - \text{minimum acceptable value of the operating parameter}}{\sigma_L}$$

where
- $\mu_L$ of the formula is a mean value of the operating parameter from the local evaluations,
- $\sigma_L$ of the formula is a standard deviation of the operating parameter from the local evaluations, and
- robustness of the formula is a margin above a minimum acceptable value of the operating parameter for the selected set of global element parameters expressed in number of local sigma.

25. The method of claim 20, wherein the distribution of the operating parameter of the circuit module in response to the local distribution of element parameters includes a limited distribution of global element parameters about a selected set of global element parameters.

26. The method of claim 25, wherein the limited distribution of global element parameters represents an expected range of global element parameters for the circuit module within a single die.

27. The method of claim 25, wherein the circuit module is an SRAM cell and the limited distribution of global element parameters represents an expected range of global element parameters within an SRAM array.

28. The method of claim 20, wherein determining a distribution of the operating parameter of the circuit module comprises:

executing a sequence of evaluations of the operating parameter of the circuit module using a circuit simulator with the element parameter values chosen randomly for respective evaluations.

29. The method of claim 20, further comprising:

setting a minimum acceptable robustness and determining a minimum operating parameter that is compatible with the minimum acceptable robustness.

30. The method of claim 29, wherein the circuit module is an SRAM cell, the operating parameter is a cell trip voltage, and the minimum operating parameter compatible with the acceptable robustness determines a voltage to which an associated bit line must be pulled within a WRITE cycle.

* * * * *